United States Patent
Tokuda

(10) Patent No.: US 10,033,018 B2
(45) Date of Patent: Jul. 24, 2018

(54) DISPLAY DEVICE AND METHOD OF MANUFACTURING A DISPLAY DEVICE

(71) Applicant: Japan Display Inc., Minato-ku (JP)

(72) Inventor: Naoki Tokuda, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/860,203

(22) Filed: Jan. 2, 2018

(65) Prior Publication Data

US 2018/0145282 A1   May 24, 2018

Related U.S. Application Data

(63) Continuation of application No. 15/439,465, filed on Feb. 22, 2017, now Pat. No. 9,893,321.

(30) Foreign Application Priority Data

Feb. 29, 2016   (JP) .................... 2016-037915

(51) Int. Cl.
  *H01L 27/32*   (2006.01)
  *H01L 51/52*   (2006.01)

(52) U.S. Cl.
  CPC ........ *H01L 51/5284* (2013.01); *H01L 27/322* (2013.01); *H01L 27/3213* (2013.01); *H01L 27/3216* (2013.01)

(58) Field of Classification Search
  None
  See application file for complete search history.

(56) References Cited

U.S. PATENT DOCUMENTS

2017/0250377 A1 *   8/2017   Tokuda ................. H01L 27/322

FOREIGN PATENT DOCUMENTS

| JP | 2014-145924 | 8/2014 |
|---|---|---|
| JP | 2014-228723 | 12/2014 |

* cited by examiner

*Primary Examiner* — Jack Chen
(74) *Attorney, Agent, or Firm* — Oblon, McClelland, Maier & Neustadt, L.L.P.

(57) ABSTRACT

A display device includes a first substrate provided with a display region including a plurality of pixels arranged in a matrix, each of the plurality of pixels having a plurality of sub-pixels, and a second substrate provided with color filters and a light-shielding film, the color filters including transmission regions selectively transmitting lights of specific colors for the respective sub-pixels, the light-shielding film blocking light. The plurality of sub-pixels include a first sub-pixel provided with the transmission region that transmits light of a first color, and a second sub-pixel provided with the transmission region that transmits light of a second color having a luminosity factor lower than that of the light of the first color. A difference in area between a light-emitting region and the transmission region in the second sub-pixel is smaller than a difference in area between a light-emitting region and the transmission region in the first sub-pixel.

5 Claims, 10 Drawing Sheets

DISPLAY DEVICE AND METHOD OF MANUFACTURING A DISPLAY DEVICE

CROSS-REFERENCE TO RELATED APPLICATION

The present application is a continuation of U.S. application Ser. No. 15/439,465, filed on Feb. 22, 2017, which claims priority to Japanese Application No. 2016-037915 filed on Feb. 29, 2016, the content of which are hereby incorporated by reference in their entirety.

BACKGROUND OF THE INVENTION

1. Field of the Invention

The present invention relates to a display device and a method of manufacturing a display device.

2. Description of the Related Art

In recent years, a thin display device such as an organic EL display device or a liquid crystal display device has remarkably developed, because of its features such as thinness, light weight, and low power consumption, as a possible substitute for a CRT, which had conventionally been in the mainstream of display devices. Especially a high resolution of a display image has developed, which requires the technique for manufacturing a color filter suitable for a display device having a high resolution.

The size of one pixel is reduced as the resolution of the display device becomes higher, so that it is necessary to form a light-shielding film having a small interval between patterns. However, forming the light-shielding film using photolithography causes a problem in that the light-shielding film having a shape as designed cannot be obtained as the interval between the patterns becomes smaller. This problem will be described with reference to FIGS. 10A to 10C.

FIG. 10A represents a photomask 1000 used for forming a light-shielding film. Here, when, for example, photolithography is performed using a positive photoresist whose solubility in a developer increases upon exposure, a light-shielding film having a shape shown in FIG. 10B is obtained due to light diffraction, scattering, or the like occurring at portions where an interval between patterns 1002 formed in the photomask 1000 is small. Moreover, when, for example, photolithography is performed using a negative photoresist whose solubility in a developer decreases upon exposure, a light-shielding film having a shape shown in FIG. 10C is obtained for a similar reason.

Therefore, for example, JP 2014-228723 A describes that portions of different amounts of exposure are provided in a picture-frame portion of a black matrix to form concave and convex patterns. In addition, JP 2014-228723 A discloses that, by reducing the activity of a developer in the vicinity of the picture-frame portion, the occurrence of narrowing or constriction of the line width of the black matrix located in the vicinity of the picture-frame portion is prevented in a color filter having a small interval between patterns.

Moreover, for example, JP 2014-145924 A discloses a method of manufacturing a light-shielding film substrate, in which a light-shielding film is formed in multiple separate steps and an interval of the light-shielding film formed in one step is widened to thereby narrow the line width of the light-shielding film.

SUMMARY OF THE INVENTION

Even when the portions of different amounts of exposure are provided to form the concave and convex patterns in the picture-frame portion as in JP 2014-228723 A, the problem of failing to obtain a light-shielding film having a shape as designed occurs as the interval between the patterns of the light-shielding film becomes small. Moreover, when the light-shielding film is formed in multiple separate steps as in JP 2014-145924 A, the luminance is reduced if a shift occurs in the position of a photomask in each step.

The invention has been made in view of the above problems, and it is an object of the invention to provide a display device whose luminance is not reduced even when a light-shielding film is formed in multiple separate steps, and a method of manufacturing the display device.

According to one aspect of the present invention, a display device includes a first substrate provided with a display region including a plurality of pixels arranged in a matrix, each of the plurality of pixels having a plurality of sub-pixels, and a second substrate provided with color filters and a light-shielding film, the color filters including transmission regions selectively transmitting lights of specific colors for the respective sub-pixels, the light-shielding film blocking light. Each of the plurality of sub-pixels includes a light-emitting element. The plurality of sub-pixels include a first sub-pixel provided with the transmission region that transmits light of a first color, and a second sub-pixel provided with the transmission region that transmits light of a second color having a luminosity factor lower than that of the light of the first color. A difference in area between a light-emitting region of the light-emitting element and the transmission region in the second sub-pixel is smaller than a difference in area between a light-emitting region of the light-emitting element and the transmission region in the first sub-pixel.

In one embodiment of the present invention, the area of the light-emitting region provided in the first sub-pixel is smaller than the area of the transmission region provided in the first sub-pixel.

In one embodiment of the present invention, the area of the transmission region provided in the first sub-pixel is smaller than the area of the light-emitting region provided in the first sub-pixel.

In one embodiment of the present invention, the plurality of sub-pixels are disposed in two rows and two columns to constitute one pixel, and the first sub-pixel and the second sub-pixel are disposed adjacent to each other.

In one embodiment of the present invention, the first color is white or green, and the second color is red or blue.

According to another aspect of the present invention, a method of manufacturing a display device includes steps of forming a first substrate provided with a display region including a plurality of pixels disposed in a matrix, forming light-emitting elements corresponding to a first sub-pixel and a second sub-pixel that are included in each of the plurality of pixels of the first substrate, forming a light-shielding film on a second substrate, removing, in the second substrate, the light-shielding film provided in a transmission region of the first sub-pixel and forming a color filter that selectively transmits light of a first color in the transmission region, removing, in the second substrate, the light-shielding film provided in a transmission region of the second sub-pixel adjacent to the first sub-pixel and forming a color filter that selectively transmits light of a second color having a luminosity factor lower than that of the light of the first color in the transmission region, and bonding the second substrate and the first substrate together using, as references, the position of the transmission region provided in the second sub-pixel and the position of a light-emitting region of the light-emitting element provided in the second sub-pixel formed in the first substrate. A difference in area between a light-emitting region of the light-emitting element and the transmission region in the second sub-pixel is formed to be smaller than a difference in area between a light-emitting region of the light-emitting element and the transmission region in the first sub-pixel.

In one embodiment of the present invention, in a mask used in removing the light-shielding film formed in the transmission regions of the first and second sub-pixels, a shape corresponding to the transmission region is circular.

DETAILED DESCRIPTION OF THE INVENTION

Figure 1:
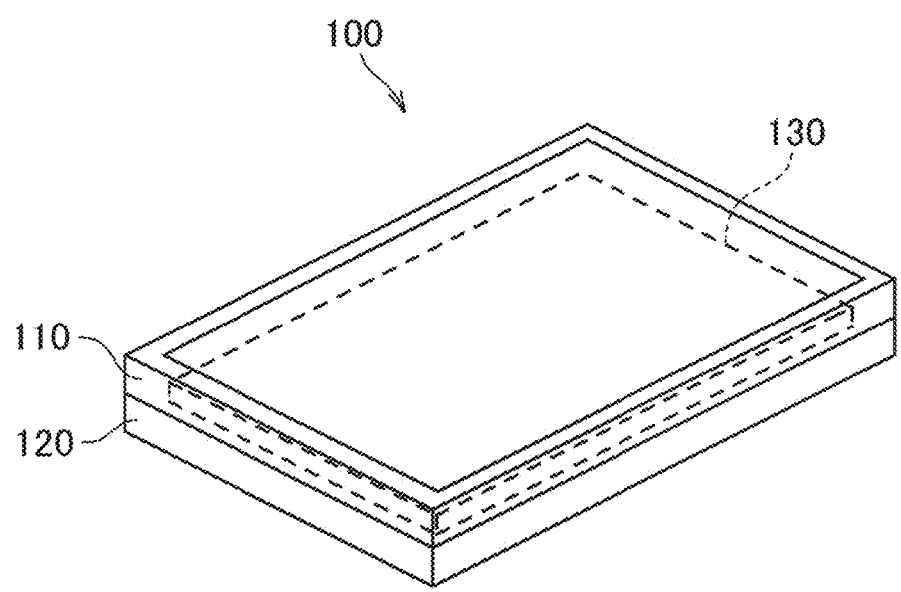
FIG. 1 is a diagram schematically showing a display device according to an embodiment of the invention.

Hereinafter, embodiments of the invention will be described with reference to the drawings. The disclosure is illustrative only. Appropriate modifications that will readily occur to those skilled in the art and fall within the spirit of the invention are of course included in the scope of the invention. For more clarity of description, the width, thickness, shape, and the like of each part may be schematically represented in the drawings, compared to those in practicing aspects of the invention. However, they are illustrative only and do not limit the interpretation of the invention. Moreover, in the specification and the drawings, elements similar to those described in relation to a previous drawing are denoted by the same reference numerals and signs, and a detailed description may be appropriately omitted.

Moreover, in the invention, when the term "on" is simply used to express an aspect in which one structure is disposed "on" another structure, the term "on" includes both the case where one structure is disposed directly on another structure so as to be in contact therewith and the case where one structure is disposed above another structure with still another structure therebetween, unless otherwise noted.

FIG. 1 is a diagram showing an overview of a display device 100 according to an embodiment of the invention. As shown in FIG. 1, the display device 100 is formed of an organic EL panel 130 fixed so as to be interposed between an upper frame 110 and a lower frame 120. In the embodiment, an organic EL display device is illustrated as an example of the disclosure. However, other application examples include all flat-panel type display devices such as a liquid crystal display device, other self-emitting type display devices, and an electronic paper-type display device including an electrophoretic element and the like. Moreover, it is needless to say that the invention is applicable to small or medium to large-sized display devices without particular limitation.

First Embodiment

Figure 2A:
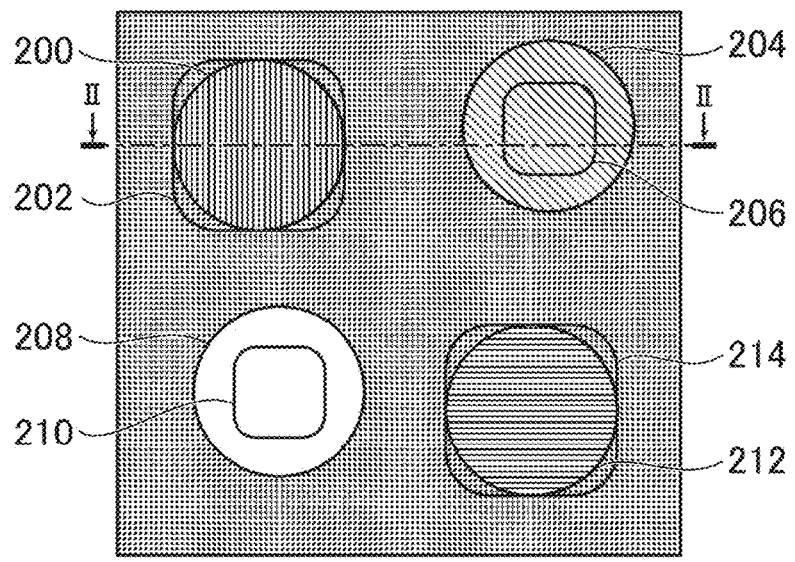
FIGS. 2A and 2B are respectively a plan view and a cross-sectional view of a pixel in a first embodiment.
Figure 2B:
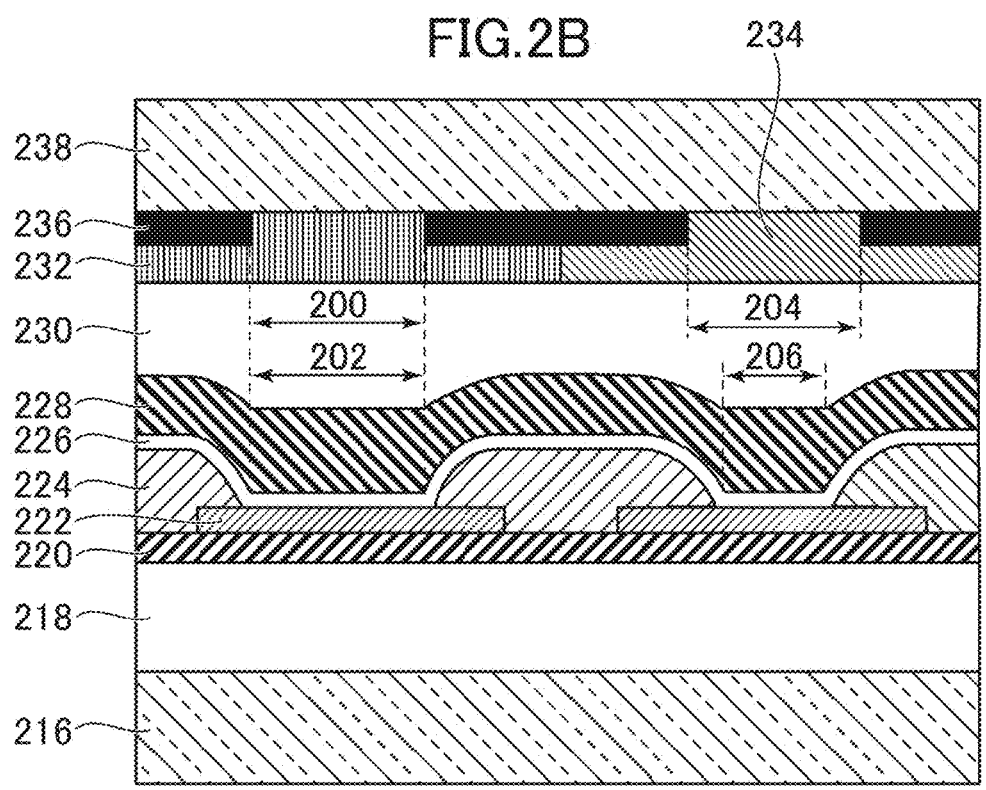

Subsequently, a first embodiment of the invention will be described. FIGS. 2A and 2B are respectively a plan view and a diagram showing a cross-section along line II-II in FIG. 2A in the first embodiment, both showing one pixel in an enlarged manner. As shown in FIG. 2A, a plurality of sub-pixels are disposed in two rows and two columns to constitute one pixel.

The sub-pixels include a first sub-pixel provided with a color filter that transmits light of a first color, and a second sub-pixel provided with a color filter that transmits light of a second color having a luminosity factor lower than that of the light of the first color. The first sub-pixel and the second sub-pixel are disposed adjacent to each other.

Specifically, the sub-pixels include a sub-pixel in which green or white light having a high luminosity factor is emitted, and a sub-pixel in which red or blue light having a low luminosity factor is emitted. On the drawing, a red sub-pixel that emits red light is disposed at the upper left, a green sub-pixel that emits green light is disposed at the upper right, a white sub-pixel that emits white light is disposed at the lower left, and a blue sub-pixel that emits blue light is disposed at the lower right. That is, the sub-pixel that emits the green or white light having a high luminosity factor is disposed so as to be adjacent to the sub-pixel that emits the red or blue light having a low luminosity factor. Sub-pixels that emit lights of four colors constitute one pixel.

One pixel is not limited to the configuration including four sub-pixels disposed in two rows and two columns. For example, one pixel may have a configuration including three sub-pixels disposed in one row and three columns, or may have other configurations.

Each of the sub-pixels includes a region that is provided in a first substrate and where light is emitted, and a transmission region that is provided in a second substrate and selectively transmits light of a specific color. Specifically, the red sub-pixel includes a region 202 that is provided in the first substrate and where white light is emitted, and a transmission region 200 that selectively transmits red light.

Similarly, the green sub-pixel includes a region 206 that is provided in the first substrate and where white light is emitted, and a transmission region 204 that selectively transmits green light. The white sub-pixel includes a region 210 that is provided in the first substrate and where white light is emitted, and a transmission region 208 that transmits white light. The blue sub-pixel includes a region 214 that is provided in the first substrate and where white light is emitted, and a transmission region 212 that selectively transmits blue light.

Further, the region where light is emitted (hereinafter the region where light is emitted is referred to as "light emission region") and the transmission region are formed such that a difference in area between the light emission region and the transmission region is smaller in the second sub-pixel than in the first sub-pixel. In the first embodiment, the area of the light emission region that is provided in the first sub-pixel is formed to be smaller than the area of the transmission region that is provided in the first sub-pixel.

Specifically, as shown in FIG. 2A, the area of the light emission region 206 or 210 of the green sub-pixel or white sub-pixel emitting green or white light having a high luminosity factor is formed to be smaller than the area of the transmission region 204 or 208 of the sub-pixel. On the other hand, the area of the light emission region 202 or 214 provided in the red sub-pixel or blue sub-pixel emitting red or blue light having a low luminosity factor is formed such that a difference in area between the region 202 or 214 and the transmission region 200 or 212 provided in the sub-pixel is minimized as much as possible.

Here, the luminances of the green and white lights, which are reduced by reducing the areas of the light emission regions 206 and 210 of the green sub-pixel and the white sub-pixel in the first substrate, are supplemented by improving the luminances of lights emitted from an EL film 226 (to be described in detail later) in the green sub-pixel and the white sub-pixel. Specifically, the luminances of the lights emitted from the green sub-pixel and the white sub-pixel are improved by increasing a current density supplied to the EL film 226 provided in the green sub-pixel and the white sub-pixel. Since the emission area of the EL film 226 in the green sub-pixel and the white sub-pixel is reduced, power consumption can be maintained even if the current density increases.

Here, the reasons for forming the light emission region and the transmission region such that the difference in area between the light emission region and the transmission region is smaller in the second sub-pixel than in the first sub-pixel will be described. Green and white lights have luminosity factors higher than those of red and blue lights; therefore, the luminance of light that is obtained after white light passes through the green or white color filter is higher than the luminance of light that is obtained after white light of the same luminance passes through the red or blue color filter.

Therefore, when the emission areas of the sub-pixels are made equal to each other, a current sent to the green sub-pixel and the white sub-pixel is generally made smaller than a current sent to the red sub-pixel and the blue sub-pixel. Accordingly, the green sub-pixel and the white sub-pixel have more room to increase the current than the red sub-pixel and the blue sub-pixel; therefore, even when the light emission region and the transmission region are formed such that the difference in area between the light emission region and the transmission region is smaller in the red sub-pixel and the blue sub-pixel than in the green sub-pixel and the white sub-pixel, a reduction in luminance can be supplemented by increasing the current sent to the green sub-pixel and the white sub-pixel.

Next, a cross-section of the pixel will be described. As shown in FIG. 2B, the display device 100 includes the first substrate, the second substrate, and a filling material 230 that bonds the first substrate and the second substrate together. The first substrate is configured to include a lower glass substrate 216, an array layer 218, a planarization film 220, lower electrodes 222, a rib 224, the EL film 226, and a sealing film 228.

The array layer 218 is configured to include an insulating layer, source electrodes, drain electrodes, gate electrodes, and a semiconductor layer, which are formed on the lower glass substrate 216. The source electrode, the drain electrode, the gate electrode, and the semiconductor layer constitute a transistor (not shown). The transistor controls a current sent for causing the EL film 226 to emit light. Herein, the array layer 218 is formed on the glass substrate, but the array layer 218 may be formed on a flexible substrate such as a resin substrate.

The planarization film 220 is formed so as to cover the array layer 218, and planarizes steps caused by wiring lines or transistors disposed in the array layer 218. The lower electrodes 222 are formed in a layer on the planarization film 220. Although not represented in FIG. 2B, through holes are formed in the planarization film 220. The lower electrode 222 is electrically connected through the through hole with the source electrode or drain electrode included in the transistor formed in the array layer 218.

The rib 224 is formed so as to cover the peripheral edge portion of the lower electrode 222. A short-circuit between the lower electrode 222 and an upper electrode included in the EL film 226 can be prevented by the rib 224.

The EL film 226 is formed on the upper layer side of the lower electrode 222 and the rib 224. Specifically, the EL film 226 is formed by stacking a hole injection layer, a hole transport layer, a light-emitting layer, an electron injection layer, an electron transport layer, and the upper electrode. The light-emitting layer emits light by recombination of holes injected from the lower electrode 222 and electrons injected from the upper electrode. The hole injection layer, the hole transport layer, the electron injection layer, and the electron transport layer are similar to those in the related art, and therefore, a description is omitted. In the embodiment, the light-emitting layer is formed using a material that emits white light.

The sealing film 228 is formed so as to cover the EL film 226. The sealing film 228 prevents molecules that become a factor in degrading the EL film 226, such as moisture, from entering into the EL film 226.

The second substrate is formed to include an upper glass substrate 238, a light-shielding film 236, a red color filter 232, and a green color filter 234. The light-shielding film 236 is formed of a material that blocks light. The red color filter 232 and the green color filter 234 are respectively formed of materials that selectively transmit red light and green light. Although not shown in FIG. 2B, color filters that selectively transmit white and blue lights are respectively provided similarly in the white sub-pixel and the blue sub-pixel. Herein, the color filters are formed on the glass substrate, but the color filters may be formed on a flexible substrate such as a resin substrate.

Subsequently, the case where shifts occur between the centers of the transmission regions 204 and 208 of the green sub-pixel and the white sub-pixel in the second substrate and the centers of the light emission regions 206 and 210 of the green sub-pixel and the white sub-pixel in the first substrate, in the embodiment, will be described. The shifts occur when the position of a photomask 900 is shifted in a step of forming the second substrate, and the cause of the occurrence of the shifts will be described in detail later.

Figure 3A:
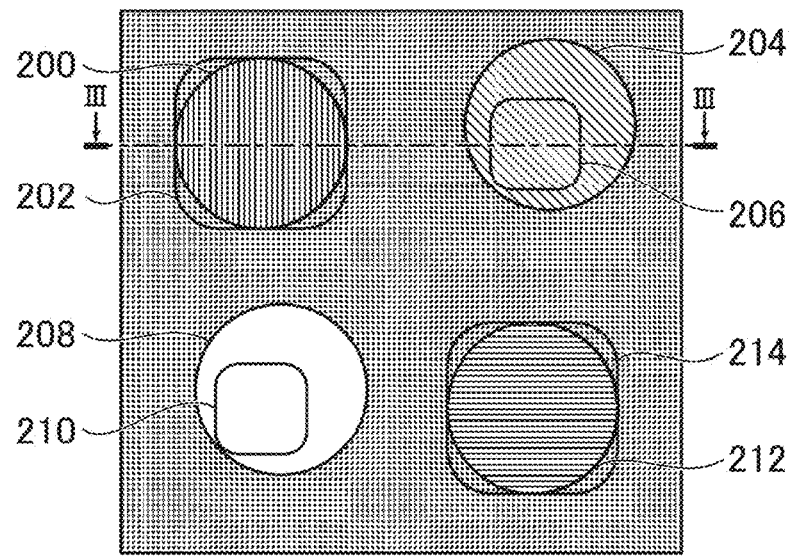
FIGS. 3A and 3B are diagrams for explaining the case where a shift occurs in the alignment of a photomask in the first embodiment.
Figure 3B:
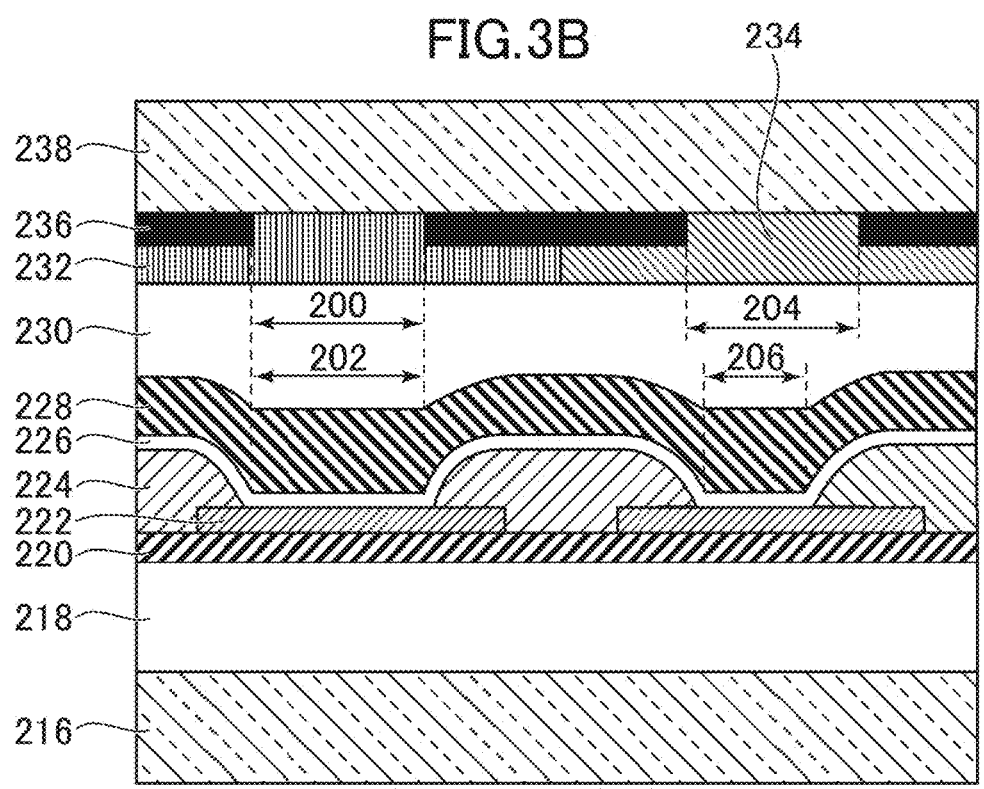

FIGS. 3A and 3B are diagrams showing the positional relationship between the second substrate and the first substrate when the shifts occur, respectively corresponding to FIGS. 2A and 2B. As shown in FIG. 3A, the centers of the transmission regions 200 and 212 of the red sub-pixel and the blue sub-pixel in the second substrate are coincident with the centers of the light emission regions 202 and 214 of the red sub-pixel and the blue sub-pixel in the first substrate. On the other hand, the centers of the transmission regions 204 and 208 of the green sub-pixel and the white sub-pixel in the second substrate are shifted in the upper-right direction on the drawing from the centers of the light emission regions 206 and 210 of the green sub-pixel and the white sub-pixel in the first substrate.

Similarly, as shown in FIG. 3B, the center of the transmission region 200 of the red sub-pixel in the second substrate is coincident with the center of the light emission region 202 of the red sub-pixel in the first substrate. On the other hand, the center of the transmission region 204 of the green sub-pixel in the second substrate is shifted to the right side on the drawing from the center of the light emission region 206 of the green sub-pixel in the first substrate.

Although the shifts occur as described above, the whole areas of the light emission regions 206 and 210 of the green sub-pixel and the white sub-pixel in the first substrate are contained in the transmission regions 204 and 208 of the green sub-pixel and the white sub-pixel in the second substrate.

Figure 4A:
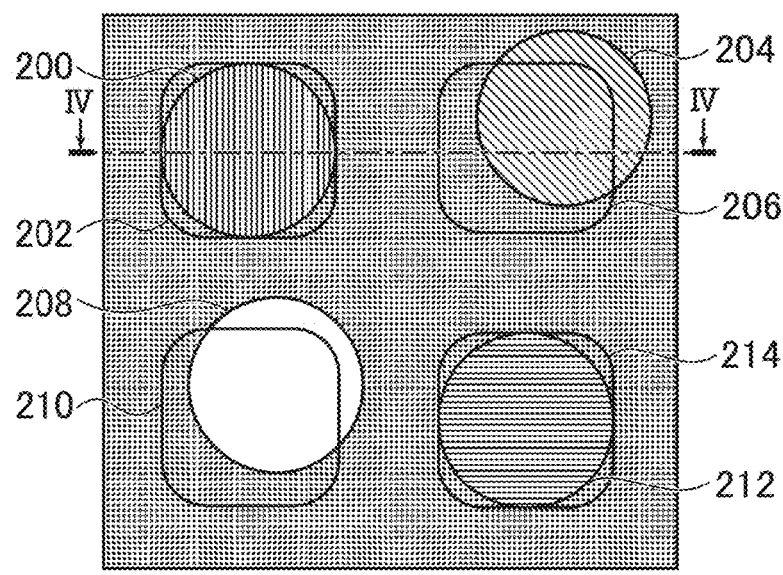
FIGS. 4A and 4B are diagrams for explaining the case where a shift occurs in the alignment of a photomask in the use of the related art.
Figure 4B:
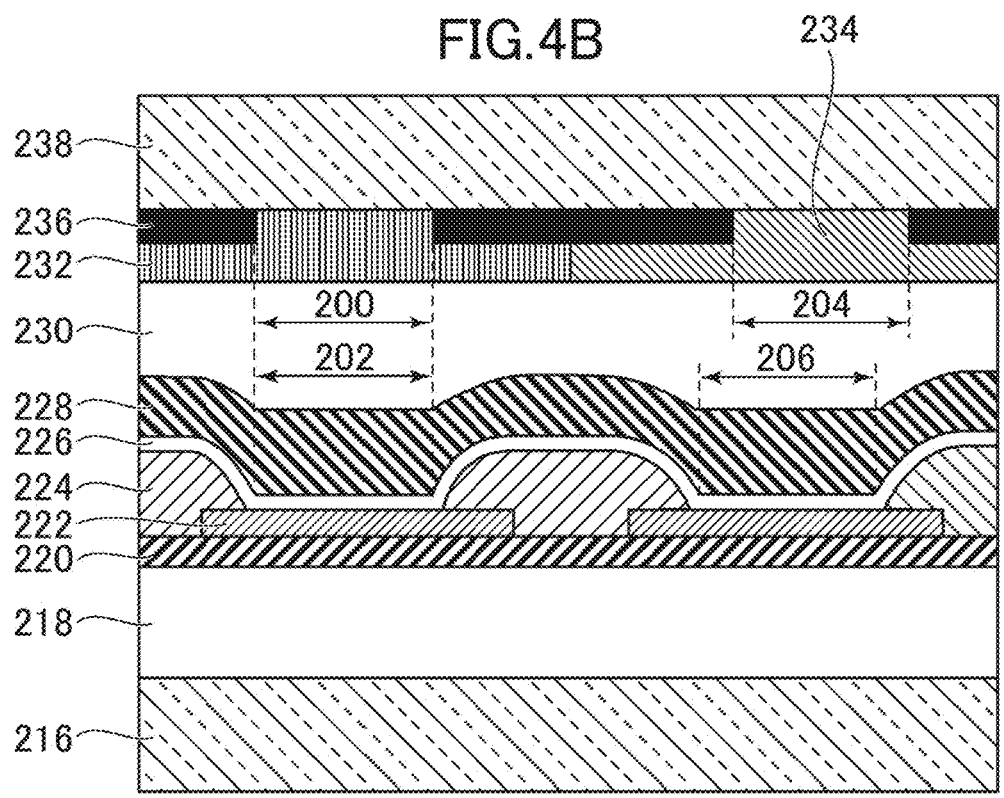

On the other hand, FIGS. 4A and 4B are diagrams for explaining the case where the transmission regions and the light emission regions of all of the sub-pixels are formed equal in size to each other as in a conventional manner and shifts similar to those described above occur. FIGS. 4A and 4B respectively correspond to FIGS. 3A and 3B.

As shown in FIGS. 4A and 4B, the centers of the transmission regions 204 and 208 of the green sub-pixel and the white sub-pixel in the second substrate are shifted from the centers of the light emission regions 206 and 210 of the green sub-pixel and the white sub-pixel in the first substrate. Therefore, portions of the light emission regions 206 and 210 of the green sub-pixel and the white sub-pixel in the first substrate overlap the light-shielding film 236 formed in the second substrate.

Accordingly, according to the related art, the luminance is reduced when the shifts occur, compared to when no shifts occur. On the other hand, according to the embodiment of the invention, even when the shifts occur, the whole areas of the light emission regions 206 and 210 of the green sub-pixel and the white sub-pixel in the first substrate are contained in the transmission regions 204 and 208 of the green sub-pixel and the white sub-pixel in the second substrate; therefore, a reduction in luminance, compared to that when no shifts occur, can be prevented.

Second Embodiment

Figure 5A:
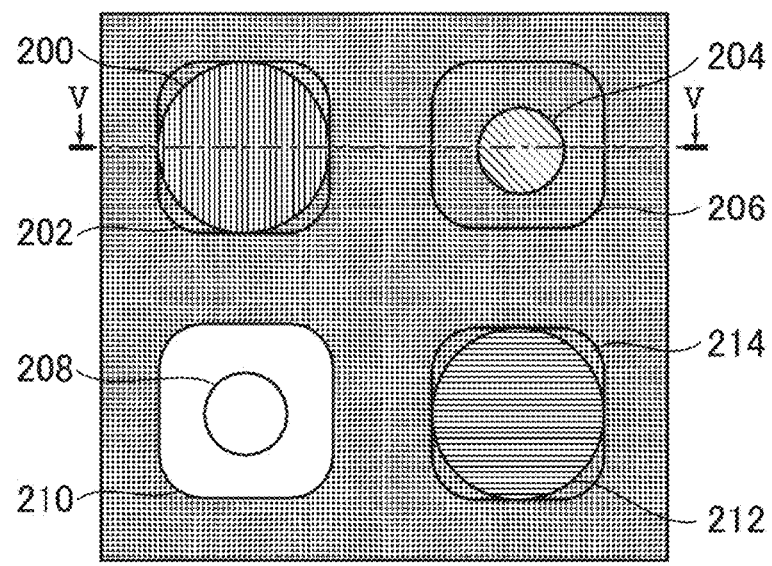
FIGS. 5A and 5B are respectively a plan view and a cross-sectional view of a pixel in a second embodiment.
Figure 5B:
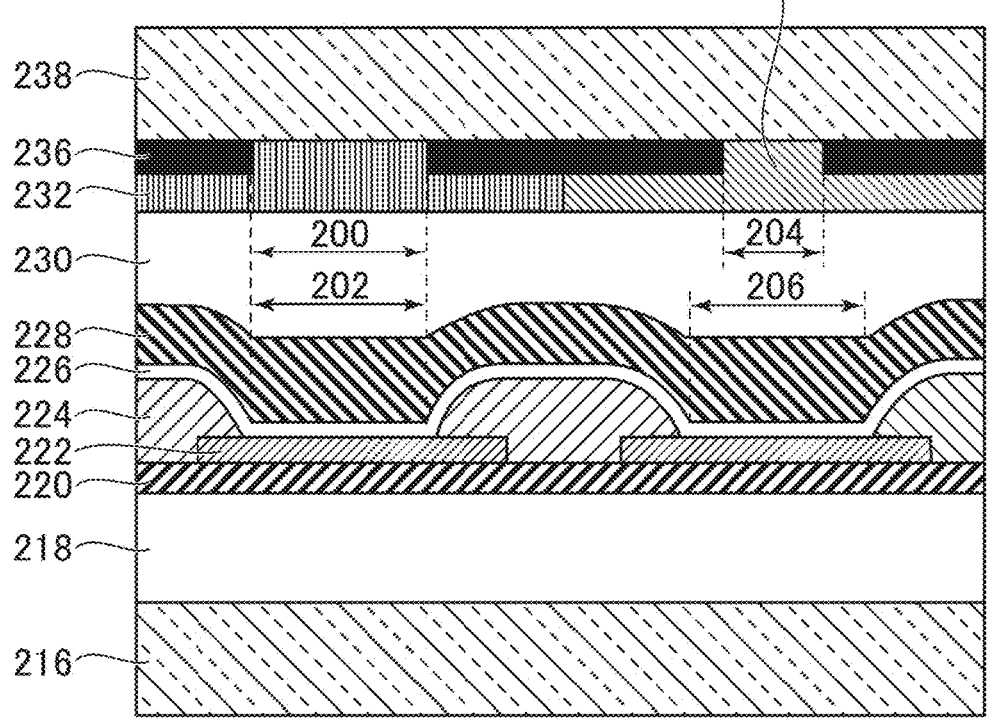

Subsequently, a second embodiment of the invention will be described. FIGS. 5A and 5B are respectively a plan view and a diagram showing a cross-section along line V-V in FIG. 5A in the second embodiment, both showing one pixel in an enlarged manner. FIGS. 5A and 5B respectively correspond to FIGS. 2A and 2B in the first embodiment, and therefore, a description of configurations similar to those of the first embodiment is omitted.

The embodiment differs, compared to the first embodiment, in that the area of the transmission region provided in the first sub-pixel is formed smaller than the area of the light emission region provided in the first sub-pixel. Specifically, as shown in FIGS. 5A and 5B, the areas of the transmission regions 204 and 208 of the green sub-pixel and the white sub-pixel in the second substrate are formed smaller than the areas of the light emission regions 206 and 210 of the green sub-pixel and the white sub-pixel in the first substrate.

Similarly to the first embodiment, the luminances of the green and white lights, which are reduced by reducing the transmission regions 204 and 208 of the green sub-pixel and the white sub-pixel in the second substrate, are supplemented by improving the luminances of lights emitted from the green sub-pixel and the white sub-pixel in the first substrate. Specifically, the luminances of the lights emitted from the EL film 226 provided in the green sub-pixel and the white sub-pixel are improved by increasing a current supplied to the EL film 226 provided in the green sub-pixel and the white sub-pixel.

Figure 6A:
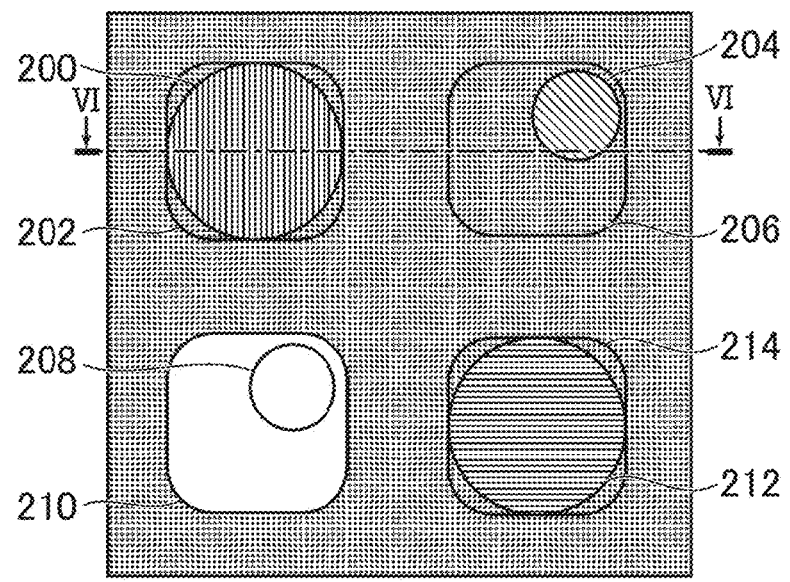
FIGS. 6A and 6B are diagrams for explaining the case where a shift occurs in the alignment of a photomask in the second embodiment.
Figure 6B:
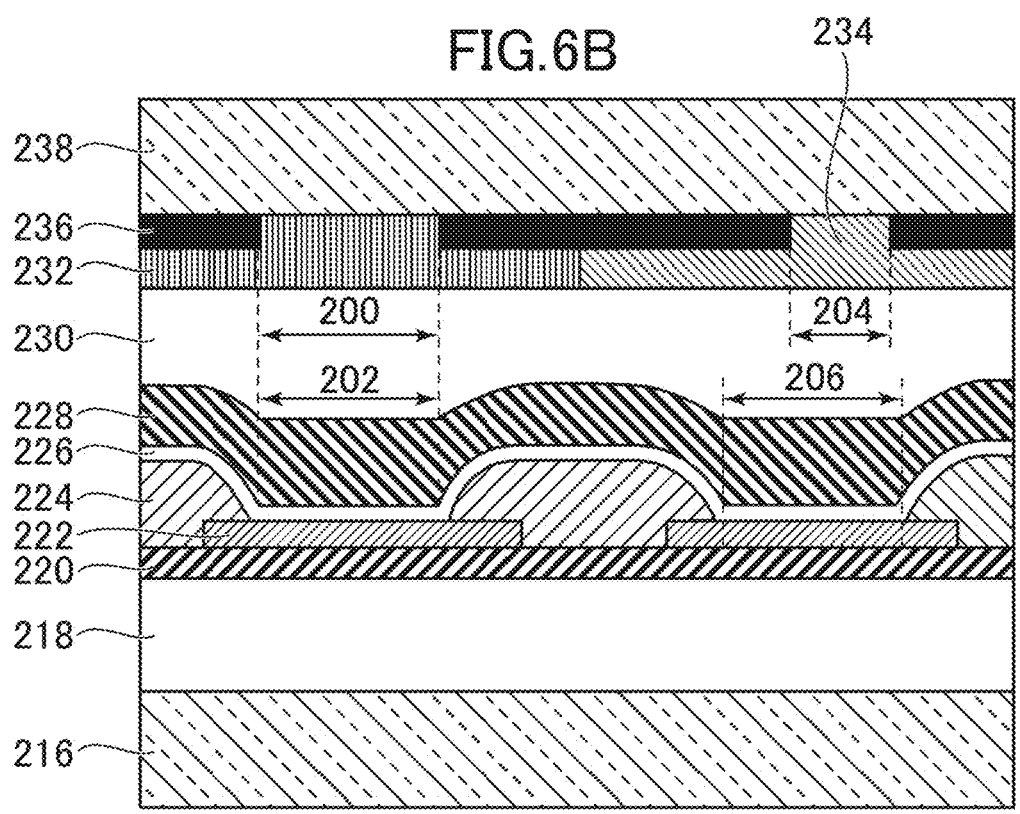

Subsequently, the case where shifts similar to those of the first embodiment occur in the second embodiment will be described. FIGS. 6A and 6B are diagrams showing the positional relationship between the second substrate and the first substrate when the shifts occur, respectively corresponding to FIGS. 5A and 5B.

As shown in FIGS. 6A and 6B, the centers of the transmission regions 200 and 212 of the red sub-pixel and the blue sub-pixel in the second substrate are coincident with the centers of the light emission regions 202 and 214 of the red sub-pixel and the blue sub-pixel in the first substrate. On the other hand, the centers of the transmission regions 204 and 208 of the green sub-pixel and the white sub-pixel in the second substrate are shifted from the centers of the light emission regions 206 and 210 of the green sub-pixel and the white sub-pixel in the first substrate.

Although the shifts occur as described above, the whole areas of the transmission regions 204 and 208 of the green sub-pixel and the white sub-pixel in the second substrate are contained in the light emission regions 206 and 210 of the green sub-pixel and the white sub-pixel in the first substrate. Accordingly, a reduction in luminance, compared to that when no shifts occur, can be prevented even when the shifts occur also in the embodiment.

Moreover, since the luminances of the green sub-pixel and the white sub-pixel are determined by the transmission regions in the second substrate according to the embodiment, variations in luminance can be reduced, compared to the first embodiment. Further, a change in color due to reflection of external light by the upper electrode or the lower electrode 222 can be reduced by reducing the transmission regions in the second substrate.

Third Embodiment

Figure 7A:
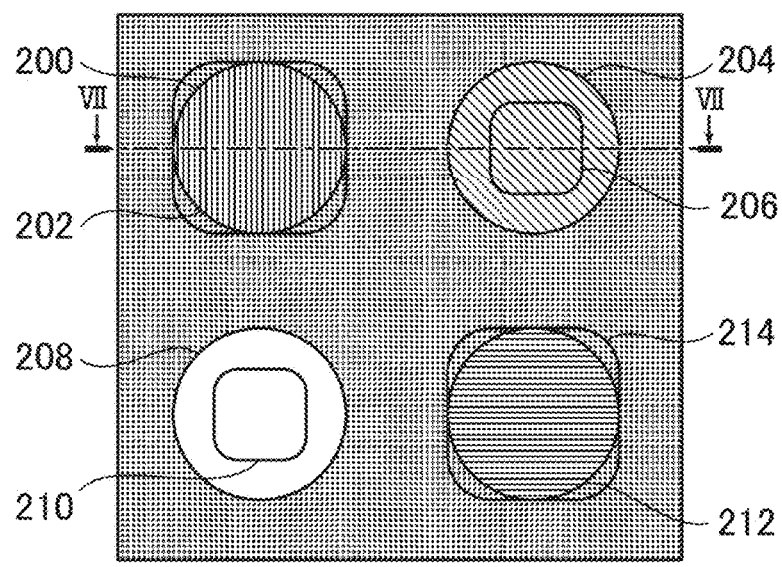
FIGS. 7A and 7B are respectively a plan view and a cross-sectional view of a pixel in a third embodiment.
Figure 7B:
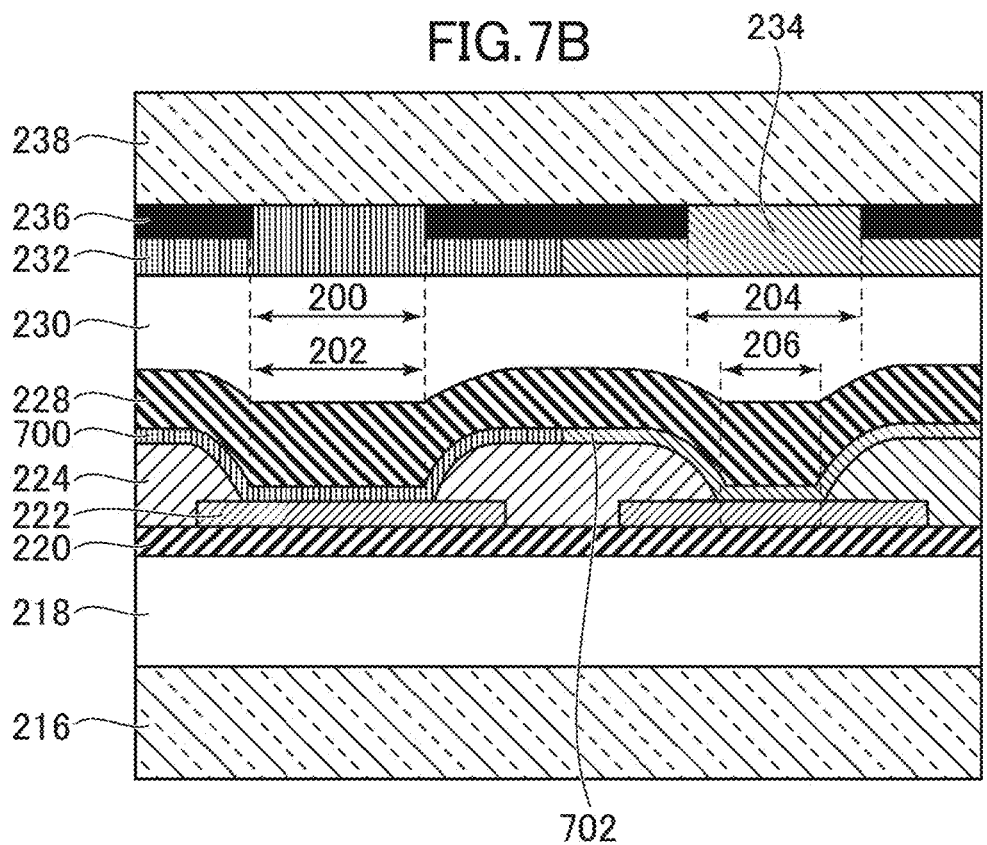
Figure 8:
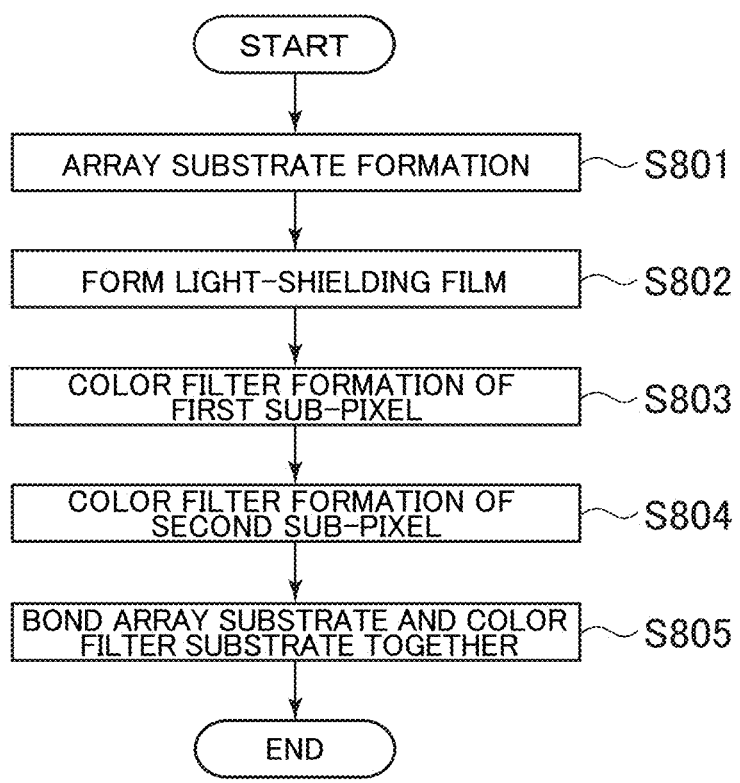
FIG. 8 is a flowchart for explaining manufacturing steps of the display device.

Subsequently, a third embodiment of the invention will be described. FIGS. 7A and 7B are respectively a plan view and a diagram showing a cross-section along line VII-VII in FIG. 7A in the third embodiment, both showing one pixel in an enlarged manner. FIGS. 7A and 7B respectively correspond to FIGS. 2A and 2B in the first embodiment, and therefore, a description of configurations similar to those of the first embodiment is omitted.

The embodiment differs, compared to the first embodiment, in that the light-emitting layer included in the EL film 226 is formed not of a material that emits white light, but of materials that emit lights of different colors for the respective sub-pixels. Specifically, as shown in FIG. 7B, a red EL film 700 that emits red light is formed in the red sub-pixel, and a green EL film 702 that emits green light is formed in the green sub-pixel. When the light-emitting layer included in the EL film 226 is formed of the materials that emit lights of different colors for the respective sub-pixels, a color filter layer is not necessarily needed. However, the color filter layer is effective as a means of further enhancing color reproducibility when, for example, the materials have differences in color purity.

According to the embodiment, a reduction in luminance can be prevented, similarly to the first embodiment, even when the shifts occur, and also, color reproducibility can be improved.

Subsequently, a method of manufacturing the display device 100 including the plurality of sub-pixels disposed in a matrix as described above will be described. First, the first substrate provided with the light emission regions for the respective sub-pixels is formed (S801). The step of forming the first substrate is similar to that of the related art, and therefore, a detailed description is omitted.

Subsequently, the light-shielding film 236 is formed so as to cover the second substrate (S802). Specifically, the light-shielding film 236 is formed of a material that does not transmit light, so as to cover the upper glass substrate.

Next, the color filter of the first sub-pixel is formed (S803). Specifically, the light-shielding film 236 is first formed so as to cover the second substrate. Then, the light-shielding film 236 provided in the transmission region of the first sub-pixel is removed in the second substrate, and a color filter that selectively transmits light of the first color is formed in the transmission region.

Figure 9A:
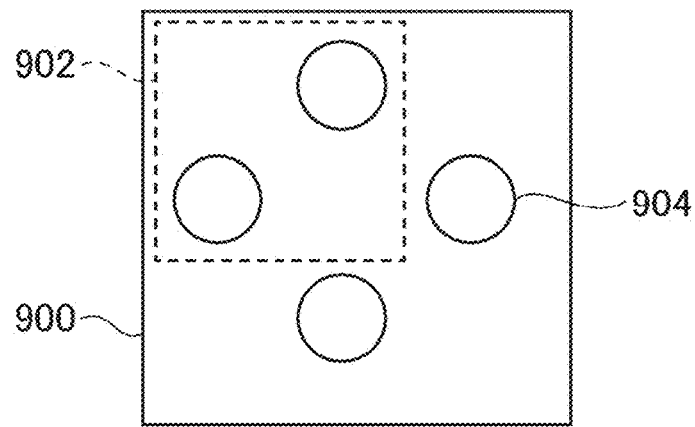
FIGS. 9A to 9C are diagrams for explaining a photomask.

For example, opening portions 904 correspond to the transmission regions 204 and 208 of the green sub-pixel and the white sub-pixel are exposed in each of pixels 902 by photolithography using the photomask 900 shown in FIG. 9A, and the light-shielding film 236 formed at the exposed portions is removed. Then, a color resist that selectively transmits green or white light is coated in the region where the light-shielding film 236 is removed.

Next, the color filter of the second sub-pixel is formed (S804). Specifically, the light-shielding film 236 provided in the transmission region of the second sub-pixel adjacent to the first sub-pixel is removed in the second substrate, and a color filter that selectively transmits light of the second color having a luminosity factor lower than that of the light of the first color is formed in the transmission region.

Figure 9B:
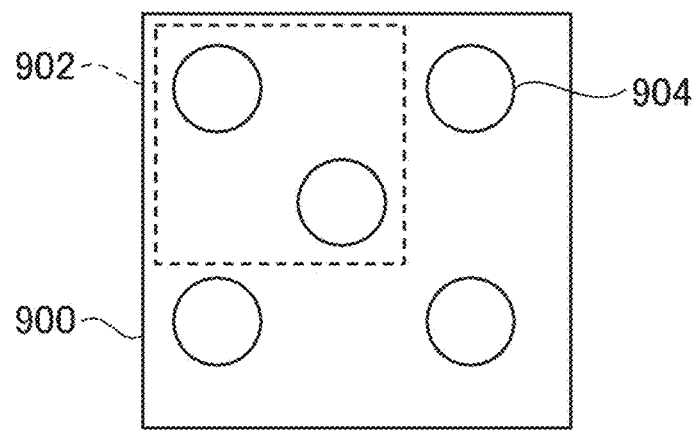
Figure 9C:
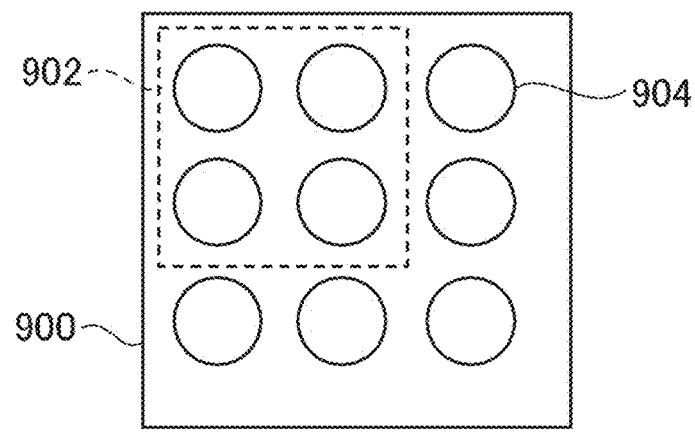
Figure 10A:
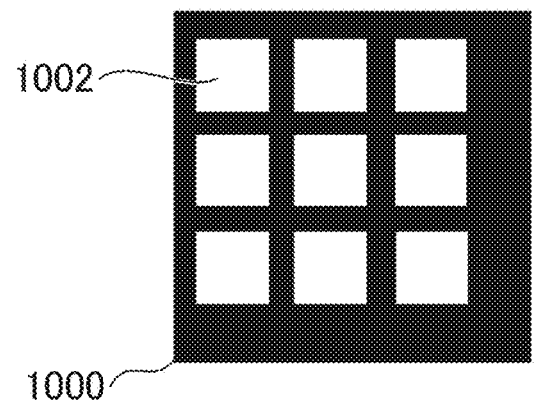
FIGS. 10A to 10C are diagrams for explaining a problem occurring when a light-shielding film is formed by the related art.
Figure 10B:
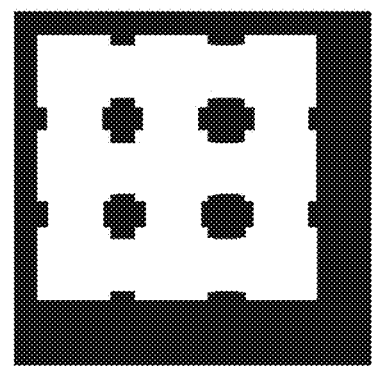
Figure 10C:
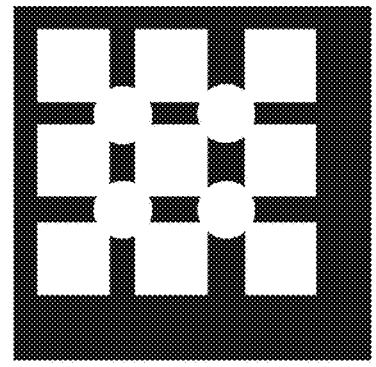

For example, opening portions 904 correspond to the transmission regions 202 and 214 of the red sub-pixel and the blue sub-pixel are exposed in each of the pixels 902 by photolithography using the photomask 900 shown in FIG. 9B, and the light-shielding film 236 formed at the exposed portions is removed. Then, a color resist that selectively transmits red or blue light is coated in the region where the light-shielding film 236 is removed.

Next, the second substrate and the first substrate are bonded together (S805). Specifically, the second substrate and the first substrate are bonded together using, as references, the position of the transmission region provided in the second sub-pixel and the position of the light emission region provided in the second sub-pixel formed in the first substrate. For example, the second substrate and the first substrate are bonded together using, as references, alignment marks formed in forming the transmission regions 200 and 212 of the red sub-pixel and the blue sub-pixel in the second substrate and alignment marks formed in forming the EL film 226 provided in the red sub-pixel and the blue sub-pixel of the first substrate.

Through the steps described above, the display device 100 including the plurality of sub-pixels disposed in a matrix as described above is completed. By forming the color filter of the first sub-pixel and the color filter of the second sub-pixel in different steps as described above, an interval between the sub-pixels is made large, and thus the color filters and the light-shielding film 236 having shapes as designed can be formed.

Moreover, since the second substrate and the first substrate are bonded together using, as a reference, the transmission region formed in the second sub-pixel, a shift may occur between the center of the transmission region formed in the first sub-pixel and the center of the light emission region formed in the first sub-pixel in the first substrate. However, even when the shift occurs, a change in luminance can be prevented according to the invention as described above.

Although, as shown in FIGS. 9A and 9B, a mask in which the shape corresponding to the transmission region is circular is used as the mask used in removing the light-shielding film 236 formed in the transmission regions of the first and second sub-pixels, the shape may be rectangular. Moreover, the step of forming the color filter of the first sub-pixel (S803) and the step of forming the color filter of the second sub-pixel (S803) are performed in random order. Further, although the case where the display device 100 is an organic EL display device has been described, the display device 100 may be a liquid crystal display device.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
   a first substrate provided with a display region including a plurality of pixels arranged in a matrix, each of the plurality of pixels having a plurality of sub-pixels; and
   a second substrate provided with color filters and a light-shielding film, the color filters including transmission regions selectively transmitting lights of specific colors for the respective sub-pixels, the light-shielding film blocking light, wherein
   each of the plurality of sub-pixels includes a light-emitting element,
   the plurality of sub-pixels include a first sub-pixel provided with the transmission region that transmits light of a first color, and a second sub-pixel provided with the transmission region that transmits light of a second color having a luminosity factor lower than that of the light of the first color, and
   a difference in area between a light-emitting region of the light-emitting element and the transmission region in the second sub-pixel is smaller than a difference in area between a light-emitting region of the light-emitting element and the transmission region in the first sub-pixel.

2. The display device according to claim 1, wherein the area of the light-emitting region provided in the first sub-pixel is smaller than the area of the transmission region provided in the first sub-pixel.

3. The display device according to claim 1, wherein the area of the transmission region provided in the first sub-pixel is smaller than the area of the light-emitting region provided in the first sub-pixel.

4. The display device according to claim 1, wherein the plurality of sub-pixels are disposed in two rows and two columns to constitute one pixel, and the first sub-pixel and the second sub-pixel are disposed adjacent to each other.

5. The display device according to claim 1, wherein the first color is white or green, and the second color is red or blue.

* * * * *